United States Patent
Shin et al.

(10) Patent No.: US 9,437,346 B2
(45) Date of Patent: Sep. 6, 2016

(54) SEMICONDUCTOR DEVICE CONNECTED BY ANISOTROPIC CONDUCTIVE ADHESIVE FILM

(71) Applicants: Kyoung Hun Shin, Uiwang-si (KR); Do Hyun Park, Uiwang-si (KR); Hyun Joo Seo, Uiwang-si (KR); Young Ju Shin, Uiwang-si (KR); Kyu Bong Kim, Uiwang-si (KR); Woo Jun Lim, Uiwang-si (KR)

(72) Inventors: Kyoung Hun Shin, Uiwang-si (KR); Do Hyun Park, Uiwang-si (KR); Hyun Joo Seo, Uiwang-si (KR); Young Ju Shin, Uiwang-si (KR); Kyu Bong Kim, Uiwang-si (KR); Woo Jun Lim, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 307 days.

(21) Appl. No.: 14/049,243

(22) Filed: Oct. 9, 2013

(65) Prior Publication Data

US 2014/0097548 A1    Apr. 10, 2014

(30) Foreign Application Priority Data

Oct. 10, 2012  (KR) .................. 10-2012-0112335

(51) Int. Cl.
*H01B 1/22* (2006.01)
*H01L 23/60* (2006.01)
*H01L 23/00* (2006.01)

(52) U.S. Cl.
CPC ............... *H01B 1/22* (2013.01); *H01L 24/29* (2013.01); *C09J 2201/602* (2013.01); *H01L 24/32* (2013.01); *H01L 2224/293* (2013.01); *H01L 2224/294* (2013.01); *H01L 2224/2929* (2013.01); *H01L 2224/2939* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29393* (2013.01); *H01L 2224/29439* (2013.01); *H01L 2224/29444* (2013.01);

(Continued)

(58) Field of Classification Search
CPC . H01B 1/00; H01B 1/22; H01L 2224/29199; H05K 3/323
See application file for complete search history.

(56) References Cited

U.S. PATENT DOCUMENTS 6,613,857 B1    9/2003  Koch et al.
2006/0148956 A1*  7/2006  Jung .................. C08K 3/08
                                      524/439

(Continued)

FOREIGN PATENT DOCUMENTS

CN      101993678 A    3/2011
CN      102486984 A    6/2012

(Continued)

OTHER PUBLICATIONS

Korean Office Action for 10-2012-0112335 dated May 28, 2015; Shin, et al.

(Continued)

*Primary Examiner* — Mark Kopec
(74) *Attorney, Agent, or Firm* — Lee & Morse, P.C.

(57) ABSTRACT

A semiconductor device connected using an anisotropic conductive adhesive composition, the anisotropic conductive adhesive composition including a thermosetting polymerization initiator; and tetrahydrofurfuryl (meth)acrylate or furfuryl (meth)acrylate, wherein the tetrahydrofurfuryl (meth)acrylate or furfuryl (meth)acrylate is present in the composition in an amount of 1 wt % to 25 wt %, based on the total weight of the composition in terms of solid content.

8 Claims, 1 Drawing Sheet

(52) U.S. Cl.
CPC ............... *H01L2224/29447* (2013.01); *H01L 2224/29455* (2013.01); *H01L 2224/29464* (2013.01); *H01L 2224/32135* (2013.01); *H01L 2224/32225* (2013.01); *H01L 2224/81903* (2013.01); *H01L 2224/8385* (2013.01); *H01L 2224/83201* (2013.01); *H01L 2224/9211* (2013.01); *H01L 2924/07802* (2013.01); *H01L 2924/07811* (2013.01)

(56) References Cited

U.S. PATENT DOCUMENTS

| | | | |
|---|---|---|---|
| 2009/0078747 A1* | 3/2009 | Park | C09J 4/00 228/249 |
| 2011/0110066 A1* | 5/2011 | Yamada | C09J 7/00 361/803 |
| 2012/0292082 A1* | 11/2012 | Miyauchi | C09J 7/0242 174/250 |

FOREIGN PATENT DOCUMENTS

| | | |
|---|---|---|
| CN | 102504707 A | 6/2012 |
| KR | 10-2009-0050144 A | 5/2009 |
| KR | 10-2012-0056044 A | 6/2012 |

OTHER PUBLICATIONS

Office Action mailed Nov. 2, 2014 in corresponding Chinese Patent Application No. 201310471433.0.

Office Action mailed Feb. 17, 2015 in corresponding Taiwanese Patent Application No. 102136554.

* cited by examiner

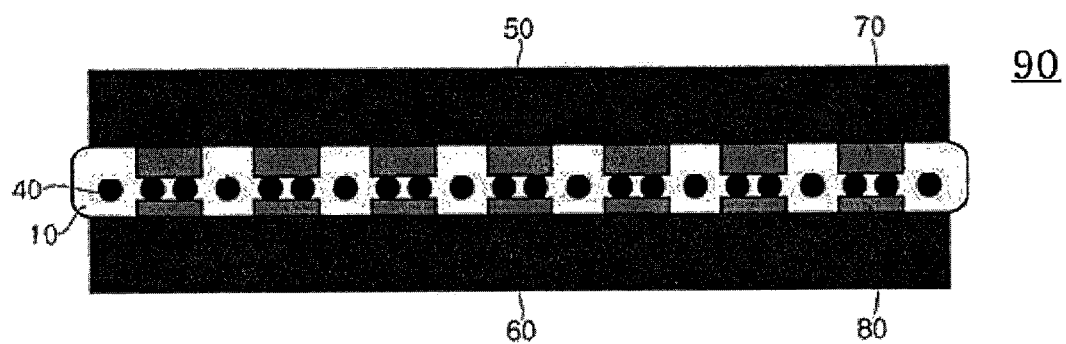

SEMICONDUCTOR DEVICE CONNECTED BY ANISOTROPIC CONDUCTIVE ADHESIVE FILM

CROSS-REFERENCE TO RELATED APPLICATION

Korean Patent Application No. 10-2012-0112335, filed on Oct. 10, 2012, in the Korean Intellectual Property Office, and entitled: "Semiconductor Device Connected by Anisotropic Conductive Adhesive Film," is incorporated by reference herein in its entirety.

BACKGROUND

1. Field

Embodiments relate to a semiconductor device connected using an anisotropic conductive adhesive composition or film, and an anisotropic conductive adhesive film prepared using the composition.

2. Description of the Related Art

With a recent trend toward large and thin displays, a pitch between electrodes and circuits may be precise and/or small. An anisotropic conductive adhesive film may perform a very important role as a wiring material to connect fine circuit terminals. As a result, an anisotropic conductive film has attracted a great deal of attention as an electrical connection material.

When an anisotropic conductive adhesive film placed between circuits to be connected is heated and pressed under certain conditions, the circuits may be connected to each other by conductive particles, and a pitch between adjacent circuits may be filled with an insulating adhesive resin to allow the conductive particles to be independently present, thereby providing a high degree of insulation.

SUMMARY

Embodiments are directed to a semiconductor device connected using an anisotropic conductive adhesive composition and an anisotropic conductive adhesive film prepared using the composition.

The embodiments may be realized by providing a semiconductor device connected using an anisotropic conductive adhesive composition, the anisotropic conductive adhesive composition including a thermosetting polymerization initiator; and tetrahydrofurfuryl (meth)acrylate or furfuryl (meth)acrylate, wherein the tetrahydrofurfuryl (meth)acrylate or furfuryl (meth)acrylate is present in the composition in an amount of 1 wt % to 25 wt %, based on the total weight of the composition in terms of solid content.

The tetrahydrofurfuryl (meth)acrylate or furfuryl (meth)acrylate may be an alkoxylated tetrahydrofurfuryl (meth)acrylate or alkoxylated furfuryl (meth)acrylate.

The anisotropic conductive adhesive composition may include the alkoxylated tetrahydrofurfuryl acrylate, the alkoxylated tetrahydrofurfuryl acrylate having a structure represented by Formula 1:

Formula 1

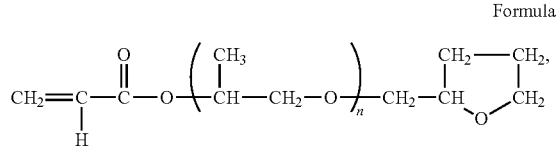

wherein n is an integer from 1 to 10.

The anisotropic conductive adhesive composition may further include a thermoplastic resin and conductive particles.

The anisotropic conductive adhesive composition may further include a radical polymerizable material, the radical polymerizable material being different from the tetrahydrofurfuryl (meth)acrylate or furfuryl (meth)acrylate.

An anisotropic conductive adhesive film prepared from the anisotropic conductive adhesive composition may have an adhesive strength reduction rate of greater than 0 to 25% or less as measured according to Equation 1:

Adhesive strength reduction rate (%)=|(A−B)/A|×100, [Equation 1]

in which A is an adhesive strength of the adhesive film after being subjected to pre-compression at 80° C. under a load of 1 MPa for 1 second and primary compression at 180° C. under a load of 3 MPa for 5 seconds, and B is an adhesive strength of the film after being subjected to the pre-compression and the primary compression, followed by reliability testing at 85° C. and 85% RH for 500 hours.

The anisotropic conductive adhesive film prepared from the anisotropic conductive adhesive composition may have a tensile strength before curing of 5 kgf/cm² or more.

The tetrahydrofurfuryl (meth)acrylate or furfuryl (meth)acrylate may be an alkoxylated tetrahydrofurfuryl (meth)acrylate or alkoxylated furfuryl (meth)acrylate.

The anisotropic conductive adhesive composition may include the alkoxylated tetrahydrofurfuryl acrylate, the alkoxylated tetrahydrofurfuryl acrylate having a structure represented by Formula 1:

Formula 1

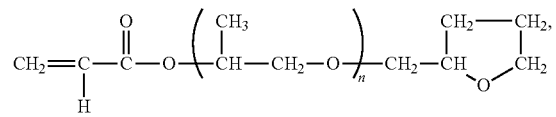

wherein n is an integer from 1 to 10.

The anisotropic conductive adhesive composition may further include a thermoplastic resin and conductive particles.

The thermoplastic resin may be present in an amount of 50 wt % to 80 wt %, based on the total weight of the anisotropic conductive adhesive composition in terms of solid content.

The embodiments may also be realized by providing a semiconductor device including a first connecting member having a first electrode; a second connecting member having a second electrode; and an anisotropic conductive adhesive film between the first connecting member and the second connecting member and connecting the first electrode to the second electrode, the anisotropic conductive adhesive film being prepared from a composition including a thermosetting polymerization initiator, and 1 wt % to 25 wt % of tetrahydrofurfuryl (meth)acrylate or furfuryl (meth)acrylate based on a total weight of the composition for forming the anisotropic conductive adhesive film in terms of solid content, and wherein the anisotropic conductive adhesive film has a tensile strength before curing of 5 kgf/cm² or more.

BRIEF DESCRIPTION OF THE DRAWING

Features will be apparent to those of skill in the art by describing in detail exemplary embodiments with reference to the attached drawing in which:

FIG. 1 illustrates a sectional view of a semiconductor device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

One embodiment provides a semiconductor device connected by an anisotropic conductive adhesive film prepared from an anisotropic conductive adhesive composition. The composition may include a thermosetting polymerization initiator and 1 wt % to 25 wt % of tetrahydrofurfuryl (meth)acrylate or furfuryl (meth)acrylate, based on a total weight of the composition for the film in terms of solid content. The anisotropic conductive adhesive film may have a tensile strength before curing of 5 kgf/cm² or more.

Another embodiment provides a semiconductor device connected by an adhesive film, which is prepared from an anisotropic conductive adhesive composition. The composition may include a thermosetting polymerization initiator and 1 wt % to 25 wt % of tetrahydrofurfuryl (meth)acrylate or furfuryl (meth)acrylate, based on the total weight of the composition for the film in terms of solid content.

As noted above, the tetrahydrofurfuryl (meth)acrylate or the furfuryl (meth)acrylate may be present in the composition in an amount of 1 wt % to 25 wt %, based on the total weight of the anisotropic conductive adhesive composition in terms of solid content. Maintaining the amount of the tetrahydrofurfuryl (meth)acrylate or the furfuryl (meth)acrylate at 1 wt % or greater may help ensure that the composition can provide sufficient adhesion. Maintaining the amount of the tetrahydrofurfuryl (meth)acrylate or the furfuryl (meth)acrylate at 25 wt % or less may help prevent problems in film formation.

In an implementation, the tetrahydrofurfuryl (meth)acrylate or the furfuryl (meth)acrylate may be an alkoxylated tetrahydrofurfuryl (meth)acrylate or alkoxylated furfuryl (meth)acrylate.

An example of the alkoxylated tetrahydrofurfuryl (meth)acrylate may be represented by Formula 1, below.

[Formula 1]

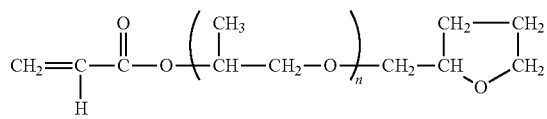

In Formula 1, n may be an integer from 1 to 10, e.g., from 1 to 5.

The anisotropic conductive adhesive composition may include a thermoplastic resin, the thermosetting polymerization initiator, and conductive particles. The anisotropic conductive adhesive composition may include 50 wt % to 80 wt % of the thermoplastic resin, based on the total weight of the composition for the film in terms of solid content. The anisotropic conductive adhesive composition may include 0.5 wt % to 5 wt % of the thermosetting polymerization initiator, based on the total weight of the composition for the film in terms of solid content. The anisotropic conductive adhesive composition may include 1 wt % to 10 wt % of the conductive particles, based on the total weight of the composition for the film in terms of solid content.

In an implementation, the anisotropic conductive adhesive composition may further include other components, e.g., a silane coupling agent, organic agents, or the like, which may be suitably used for the anisotropic conductive adhesive composition.

The anisotropic conductive adhesive composition may further include a suitable radical polymerizable material, in addition to or different from the tetrahydrofurfuryl (meth)acrylate or furfuryl (meth)acrylate.

The anisotropic conductive adhesive film prepared from the composition may have an adhesive strength reduction rate of greater than 0% to 25% or less, as measured according to Equation 1, below.

$$\text{Adhesive strength reduction rate }(\%)=|(A-B)/A|\times 100 \quad \text{Equation 1}$$

In Equation 1, A is the adhesive strength of the adhesive film after being subjected to pre-compression at 80° C. under a load of 1 MPa for 1 second and primary compression at 180° C. under a load of 3 MPa for 5 seconds, and B is the adhesive strength of the film after being subjected to pre-compression at 80° C. under a load of 1 MPa for 1 second and primary compression at 180° C. under a load of 3 MPa for 5 seconds, followed by reliability testing at 85° C. and 85% RH for 500 hours.

In an implementation, the adhesive strength reduction rate may be greater than 0% to 20% or less, e.g., greater than 0% to 15% or less. The anisotropic conductive adhesive film may have an adhesive strength of 800 N/25 mm or more, e.g., 900 N/25 mm or more, or 950 N/25 mm or more, as measured after pre-compression at 80° C. under a load of 1 MPa for 1 second and primary compression at 180° C. under a load of 3 MPa for 5 seconds.

The anisotropic conductive adhesive film according to an embodiment may have a tensile strength before curing of 5 kgf/cm² or more. The tensile strength of the adhesive film before curing may relate to film formability. Maintaining the tensile strength before curing at 5 kgf/cm² or more may help prevent a decrease in reel stability of the film, which may be caused by low film strength. In an implementation, the adhesive film may have a tensile strength before curing ranging from at least 5 kgf/cm² to 50 kgf/cm² or less.

Not limited to a specific theory, the tetrahydrofurfuryl (meth)acrylate or furfuryl (meth)acrylate may be used as a thermosetting radical polymerizable material, thereby improving adhesive strength of the anisotropic conductive adhesive composition, and its content of 1 to 25 wt % may increase a tensile strength before curing.

The embodiments provide a semiconductor device connected by the anisotropic conductive adhesive film.

According to an embodiment, a semiconductor device may include a first connecting member having a first electrode; a second connecting member having a second electrode; and an anisotropic conductive adhesive film between the first connecting member and the second connecting member. Thus, the anisotropic conductive adhesive film may connect the first electrode to the second electrode.

FIG. 1 illustrates a sectional view of a semiconductor device 90 according to an embodiment. Referring to FIG. 1, the semiconductor device 90 may include first and second connecting members 50, 60 connected to each other via an anisotropic conductive adhesive film 10 (including conductive particles 40) and including first and second electrodes 70, 80, respectively. In an implementation, when the anisotropic conductive adhesive film 10 is placed and compressed between the first connecting member 50 having the first electrode 70 and the second connecting member 60 having the second electrode 80, the first electrode 70 and the second electrode 80 may be electrically connected to each other through conductive particles 40.

The first and second connecting members may have similar structures in terms of material, thickness, size, and interconnectivity. The first and second connecting members may have a thickness of, e.g., about 20 μm to 100 μm. In an implementation, the first and second connecting members may have different structures and functions in terms of material, thickness, size, and interconnectivity. The first connecting member or the second connecting member may be formed of, e.g., glass, PCB (Printed Circuit Board), fPCB, COF, TCP, ITO glass, or the like. The first electrode or the second electrode may be a protruding electrode or a flat electrode. When the first and second electrodes are protruding electrodes, the electrodes may have a height (H) of about 2.50 μm to about 10 μm, a width (W) of about 50 μm to about 90 μm, and a gap (G) between electrodes of about 50 μm to about 110 μm. In an implementation, the electrodes may have a height (H) of about 2.50 μm to about 9 μm, a width (W) of about 50 μm to about 80 μm, and a gap (G) of about 60 μm to about 90 μm.

When the first and second electrodes are flat electrodes, the electrodes may have a thickness of about 500 Å to about 1,200 Å.

The first or second electrode may be formed of, e.g., ITO, copper, silicon, IZO, and the like.

Respective components of the anisotropic conductive adhesive composition according to an embodiment will be described in more detail.

Thermoplastic Resin

The thermoplastic resin may be a binder system acting as a matrix for forming the anisotropic conductive adhesive film. The thermoplastic resin may include at least one selected from among suitable thermoplastic resins. For example, the thermoplastic resin may include at least one of polyurethane, acrylonitrile, acryl, butadiene, polyamide, olefin, or silicone resins. In an implementation, the thermoplastic resin may be selected from among polyurethane, acrylic, or butadiene resins. In an implementation, the thermoplastic resin may include at least one selected from among an acrylate modified urethane resin, an acrylonitrile butadiene copolymer, or an acryl copolymer.

For example, the anisotropic conductive adhesive composition according to an embodiment may include an acrylate modified urethane resin as the thermoplastic resin component, in view of flowability and adhesion. In an implementation, the acrylate modified urethane resin may be present in the composition in an amount of 15 wt % to 55 wt % in terms of solid content. In an implementation, the acrylate modified urethane resin may be present in the anisotropic conductive adhesive composition in an amount of 20 wt % to 50 wt % in terms of solid content.

As a binder system, the acrylate modified urethane resin may have a low glass transition temperature to have improved flowability, thereby allowing a urethane group in the molecular chain to exhibit high adhesion. For example, when used for the anisotropic conductive film, the acrylate modified urethane resin may reduce the temperature of a connection process by improving curing performance.

Examples of the acrylate modified urethane resin may include diisocyanates, polyols, and acrylates.

Examples of the diisocyanates may include aromatic, aliphatic, alicyclic diisocyanates, and combinations thereof. For example, the diisocyanate may include at least one of tetramethylene-1,4-diisocyanate, hexamethylene-1,6-diisocyanate, cyclohexylene-1,4-diisocyanate, methylenebis(4-cyclohexyl isocyanate), isophorone diisocyanate, 4-4 methylenebis (cyclohexyl diisocyanate), or mixtures thereof.

The polyol may be, e.g., polyester polyol, polyether polyol, polycarbonate polyol, or the like, which has two or more hydroxyl groups. The polyester polyol may be obtained through condensation of a dicarboxylic acid compound and a diol compound. Examples of the dicarboxylic acid compound may include succinic acid, glutaric acid, isophthalic acid, adipic acid, suberic acid, azelaic acid, sebasic acid, dodecanedicarboxylic acid, hexahydrophthalic acid, isophthalic acid, terephthalic acid, ortho-phthalic acid, tetrachlorophthalic acid, 1,5-naphthalenedicarboxylic acid, fumaric acid, maleic acid, itaconic acid, citraconic acid, mesaconic acid, tetrahydrophthalic acid, and the like. Examples of the diol compound may include ethylene glycol, propylene glycol, 1,3-propanediol, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1, 3-pentanediol, 2,2,4-trimethyl-1,3-pentanediol, 1,4-cyclohexanedimethanol, and the like. Examples of the polyether polyol may include polyethylene glycol, polypropylene glycol, polytetraethylene glycol, and the like. For the polyether polyol, the polyol may have a weight average molecular weight of 400 g/mol to 10,000 g/mol, e.g., a weight average molecular weight of 400 g/mol to 3,000 g/mol. The polycarbonate polyol may include polyalkylene carbonate, silicone-derived polycarbonate polyol, or the like.

The acrylate may include, e.g., hydroxy acrylate or amine acrylate.

The acrylate modified urethane resin may be prepared by, e.g., polymerization of the aforementioned three components such that a molar ratio (NCO/OH) of the diisocyanate group (NCO) to the hydroxyl group (OH) ranges from 1 to 3 and the polyol is present in an amount of 70 wt % or less based on a total amount of two components excluding the acrylate. Specifically, the acrylate modified urethane resin may be prepared by steps of polymerizing the polyol with the diisocyanate to prepare a urethane resin; and reacting hydroxyl acrylate or amine acrylate with any one of terminal diisocyanates of the prepared urethane resin in a molar ratio of 0.1 to 2.1. In addition, the remaining isocyanate group may be reacted with alcohols to produce a final acrylate modified urethane resin. Polymerization may be performed by a suitable polymerization process. In an implementation, the polymerization may be performed at, e.g., a reaction temperature of 90° C. and a reaction pressure of 1 atm for 5 hours using a tin-based catalyst.

The acrylate modified urethane resin may exhibit two glass transition temperatures (Tg), at least one of which being 0° C. or more.

For example, the acrylate modified urethane resin may act as a binder system, and may be obtained by phase mixing of polyol as a soft segment and diisocyanate as a hard segment and may have a single glass transition temperature of 0° C. or more, or two glass transition temperatures, at least one of which being 0° C. or more, to allow film formation at room temperature. In addition, the acrylate modified urethane resin may act as a curing system through a terminal acrylate group by allowing curing reaction to proceed together with acryls in the curing system, thereby providing excellent adhesive strength and high connection reliability.

The acrylate modified urethane resin may have a weight average molecular weight of 20,000 g/mol to 100,000 g/mol, e.g., 20,000 g/mol to 40,000 g/mol.

In the anisotropic conductive adhesive composition, the thermoplastic resin may be present in an amount of 50 wt % to 80 wt %, e.g., 45 wt % to 75 wt %, based on the total weight of the composition (for the film) in terms of solid content.

Thermosetting Radical Polymerizable Material

The tetrahydrofurfuryl (meth)acrylate or furfuryl (meth)acrylate may be used as a thermosetting radical polymerizable material, thereby improving adhesive strength of the anisotropic conductive adhesive composition.

In an implementation, the tetrahydrofurfuryl (meth)acrylate or furfuryl (meth)acrylate may be an alkoxylated tetrahydrofurfuryl (meth)acrylate or alkoxylated furfuryl (meth)acrylate. Alkoxylated tetrahydrofurfuryl (meth)acrylate or alkoxylated furfuryl (meth)acrylate may be advantageous in terms of adhesive strength improvement.

The alkoxylated tetrahydrofurfuryl acrylate may have a structure represented by Formula 1, below

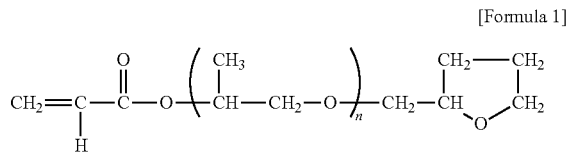

[Formula 1]

In Formula 1, n may be an integer from 1 to 10, e.g., from 1 to 5.

The tetrahydrofurfuryl (meth)acrylate or furfuryl (meth)acrylate may be present in the composition in an amount of 1 wt % to 25 wt %, based on the total weight of the anisotropic conductive adhesive composition in teens of solid content. Maintaining the amount of tetrahydrofurfuryl (meth)acrylate or furfuryl (meth)acrylate at 1 wt % or greater may help ensure that sufficient improvement in adhesive strength is obtained. Maintaining the amount of tetrahydrofurfuryl (meth)acrylate or furfuryl (meth)acrylate at 25 wt % or less may help prevent a problem in terms of film formability.

Other Thermosetting Radical Polymerizable Materials

In addition to the tetrahydrofurfuryl (meth)acrylate or furfuryl (meth)acrylate, the composition may include other thermosetting radical polymerizable materials, e.g., different from the tetrahydrofurfuryl (meth)acrylate or furfuryl (meth)acrylate. The other thermosetting radical polymerizable material may include a suitable radical polymerizable material. In an implementation, the other thermosetting radical polymerizable material may include an epoxy group modified acrylic monomer or polymer, or a phosphorus-containing acrylic monomer. Examples of other radical polymerizable material may include other acrylates, methacrylates, and maleimide compounds, which may be used in monomer form, oligomer form, or a combination thereof. Examples of the acrylate (methacrylate) may include methyl acrylate, ethyl acrylate, isopropyl acrylate, isobutyl acrylate, ethylene glycol diacrylate, diethylene glycol diacrylate, trimethylol propane triacrylate, tetramethylol methane tetraacrylate, 2-hydroxy-1,3-diacryloxypropane, 2,2-bis[4-(acryloxypolymethoxy)phenyl]propane, 2,2-bis[4-(acryloxypolyethoxy)phenyl]propane, dicyclopentenyl acrylate, tricyclodecanyl acrylate, and tris(acryloyloxyethyl)isocyanurate. The acrylates and methacrylates may be used alone or in combination thereof.

The maleimide compounds may contain at least two maleimide groups. Examples of such maleimide compounds may include 1-methyl-2,4-bismaleimidebenzene, N,N'-m-phenylenebismaleimide, N,N'-p-phenylenebismaleimide, N,N'-m-tolylenebismaleimide, N,N'-4,4-biphenylenebismaleimide, N,N'-4,4-(3,3'-dimethylbiphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-4,4-diphenyletherbismaleimide, N,N'-3,3'-diphenylsulfonebismaleimide, 2,2-bis(4-(4-maleimidephenoxy)phenyl)propane, 2,2-bis(3-s-butyl-4-8(4-maleimidephenoxy)phenyl)propane, 1,1-bis(4-(4-maleimidephenoxy)phenyl)decane, 4,4'-cyclohexylidene bis(1-(4-maleimidophenoxy)-2-cyclohexylbenzene, 2,2-bis(4-(4-maleimidophenoxy)phenyl)hexafluoropropane, and the like. The maleimide compounds may be used alone or in combination thereof.

The radical polymerizable material may be present in the composition in an amount of 1 wt % to 20 wt %, e.g., 5 wt % to 15 wt %, based on the total weight of the anisotropic conductive adhesive composition in terms of solid content.

Thermosetting Polymerization Initiator

The thermosetting polymerization initiator may include a suitable thermosetting polymerization initiator. Examples of the thermosetting polymerization initiator may include peroxide initiators and azo initiators. Examples of peroxide initiators may include lauryl peroxide, benzoyl peroxide, and cumene hydroperoxide. Examples of azo initiators may include 2,2'-azobis(4-methoxy-2,4-dimethylvaleronitrile), dimethyl 2,2'-azobis(2-methylpropionate), and 2,2'-azobis (N-cyclohexyl-2-methyl propionamide).

The thermosetting polymerization initiator may be present in the composition in an amount of 0.5 wt % to 5 wt %, e.g., 1 wt % to 4 wt %, based on the total weight of the anisotropic conductive adhesive composition in terms of solid content.

Conductive Particles

The conductive particles may be used as fillers for imparting conductive properties to the composition for the anisotropic conductive adhesive film. Examples of the conductive particles may include metal particles, such as gold (Au), silver (Ag), nickel (Ni), copper (Cu), palladium (Pb), and solder particles; carbon particles; resin particles such as polyethylene, polypropylene, polyester, polystyrene, polyvinyl alcohol and modified resin particles thereof plated or coated with metals such as gold (Au), silver (Ag), nickel (Ni), copper (Cu), palladium (Pd), and solder; and insulated conductive particles obtained by further coating insulating particles on the metal-coated polymer resin particles.

In an implementation, the conductive particles may have an average particle diameter of 1 μm to 20 μm. With such a size, the conductive particles may stably realize electrical characteristics and may help improve connection reliability. In an implementation, the conductive particles may have an average particle diameter of 1 μm to 5 μm.

The conductive particles may be present in the composition in an amount of 1 wt % to 10 wt % in terms of solid content. Within this content range of the conductive particles, the composition may exhibit stable electric characteristics in consideration of electric properties such as short circuit, or the like. In an implementation, the conductive particles may be present in an amount of 1 wt % to 5 wt %.

The anisotropic conductive adhesive composition according to an embodiment may further include additives, e.g., polymerization inhibitors, anti-oxidants, heat stabilizers, or the like, in order to provide additional properties without deteriorating fundamental properties. The additives may be present in the composition in an amount of, e.g., 0.01 wt % to 10 wt % in terms of solid content.

The polymerization inhibitor may be selected from the group of hydroquinone, hydroquinone monomethylether, p-benzoquinone, phenothiazine, and mixtures thereof. The anti-oxidant may include phenolic or hydroxy cinnamate materials. For example, the anti-oxidant may include tetrakis-(methylene-(3,5-di-t-butyl-4-hydroxycinnamate)methane, 3,5-bis(1,1-dimethylethyl)-4-hydroxy-benzenepropanoic acid thiol di-2,1-ethanediyl ester, or the like.

The embodiments provide an anisotropic conductive adhesive film prepared using the anisotropic conductive adhesive composition. The embodiments also provide a semiconductor device connected using the anisotropic conductive adhesive composition or film. No special apparatus or equipment is required to form the anisotropic conductive film. For example, the anisotropic conductive film may be obtained by dissolving the anisotropic conductive adhesive composition in an organic solvent such as toluene, stirring the mixture for a certain period of time at a rate that does not cause pulverization of the conductive particles, applying the mixture to an appropriate thickness (e.g., 10 μm to 50 μm) onto a release film, and drying the mixture for a sufficient time to vaporize the toluene.

The following Examples and Comparative Examples are provided in order to highlight characteristics of one or more embodiments, but it will be understood that the Examples and Comparative Examples are not to be construed as limiting the scope of the embodiments. Further, it will be understood that the embodiments are not limited to the particular details described in the Examples and Comparative Examples.

EXAMPLES

Examples 1 to 5

Preparation of Anisotropic Conductive Adhesive Composition and Film

A butadiene resin, a urethane resin, a radical polymerizable material, a thermosetting polymerization initiator, conductive particles, and silica were blended with toluene (as an organic solvent), in amounts as listed in Table 1, below, followed by dissolving and dispersing the mixture using a planetary mixer. Then, the resulting mixture was coated on a peel treated PET film using heat convection oven at 60° C. for 5 minutes to evaporate the solvent, thereby preparing each of anisotropic conductive adhesive films in Examples 1 to 5.

Comparative Examples 1 and 2

Preparation of Anisotropic Conductive Adhesive Composition and Film

Anisotropic conductive adhesive films were prepared in the same manner as in Example 1 except for the amounts of components as shown in Table 1.

In the Examples and Comparative Examples, the respective components were added in amounts as shown in Table 1.

TABLE 1

|  | Example 1 | Example 2 | Example 3 | Example 4 | Example 5 | Comparative Example 1 | Comparative Example 2 |
|---|---|---|---|---|---|---|---|
| 1. Butadiene resin | 5 | 5 | 5 | 5 | 5 | 5 | 5 |
| 2. Urethane resin 1 | 30 | 30 | 30 | 30 | 30 | 30 | 30 |
| 3. Urethane resin 2 | 36 | 36 | 36 | 27 | 22 | 36 | 12 |
| 4. Radical polymerizable material 1 | 13 | 9 | 9 | 9 | 9 | 15 | 9 |
| 5. Radical polymerizable material 2 | 2 | 6 | 0 | 15 | 20 | 0 | 30 |
| 6. Radical polymerizable material 3 | 0 | 0 | 6 | 0 | 0 | 0 | 0 |
| 7. Polymerization initiator | 3 | 3 | 3 | 3 | 3 | 3 | 3 |
| 8. Conductive particle | 7 | 7 | 7 | 7 | 7 | 7 | 7 |
| 9. Silica | 4 | 4 | 4 | 4 | 4 | 4 | 4 |
| Total | 100 | 100 | 100 | 100 | 100 | 100 | 100 |

1. Butadiene resin: Acrylonitrile butadiene copolymer (1072CGX, Zeon Chemical Co., Ltd.) dissolved in toluene/methylethylketone to 25 vol % (% by volume).

2. Urethane resin 1: 60 wt % of a polyol, 39 wt % of aliphatic diisocyanate, 1 wt % of hydroxylmethacrylate in methylethylketone of 50 vol % were used in preparing urethane resin 1. First, the polyol was reacted with the aliphatic diisocyanate to produce prepolymer having aliphatic diisocyanate group at the end. Then, the prepolymer was reacted with hydroxyl methacrylate in a mole ratio of hydroxyl methacrylate/the aliphatic diisocyanate of 0.5, at 90° C. and 1 atm for 5 hours to prepare polyurethane acrylate resin (weight average molecular weight: 25,000 g/mol).

3. Urethane resin 2: 60 wt % of a polyol, 39 wt % of aliphatic diisocyanate, 1 wt % of hydroxyl methacrylate in methylethylketone of 50 vol % were used in preparing urethane resin 1. First, the polyol was reacted with the aliphatic diisocyanate to produce prepolymer having aliphatic diisocyanate group at the end. Then, the prepolymer was reacted with hydroxyl methacrylate in a mole ratio of hydroxyl methacrylate/the aliphatic diisocyanate of 1, at 90° C. and 1 atm for 5 hours to prepare polyurethane acrylate resin (weight average molecular weight: 28,000 g/mol)

4. Radical polymerizable material 1: Epoxy acrylate polymer (SP1509, Showa Polymer Co., Ltd.)

5. Radical polymerizable material 2: tetrahydrofurfuryl methacrylate (M151, Miwon Commercial Co., Ltd.)
6. Radical polymerizable material 3: Alkoxylated tetrahydrofurfuryl acrylate (CD611, Sartomer Co., Ltd.)
7. Polymerization initiator: Benzoyl peroxide
8. Conductive particles: Conductive particles having a particle size of 5 μm
9. Silica: Fumed silica Experimental Example Measurement of Adhesive Strength, Connection Resistance, and Tensile Strength Before Curing Adhesive strength, connection resistance, and tensile strength before curing of the anisotropic conductive adhesive films prepared in the Examples and Comparative Examples were measured, and results are shown in Table 2, below.

(1) Adhesive Strength

To evaluate adhesive strength of each of the anisotropic conductive adhesive films prepared in the Examples and Comparative Examples, a 200 μm pitch PCB (BH Flex, terminal width: 100 μm, distance between terminals: 100 μm) and a COF (terminal width: 100 μm, distance between terminals: 100 μm) were used. Each of the anisotropic conductive adhesive films was placed on a circuit region of the PCB and pre-compression was performed at 70° C. and 1 MPa for 1 second, and a release film was removed therefrom. Next, circuits of the COF are connected to the film, followed by primary compression at 180° C. and 3 MPa for 5 seconds. Adhesive strength of the prepared specimens was evaluated by the following method, and the obtained adhesive strength was defined as initial adhesive strength.

In addition, for reliability testing, the specimens were left in a chamber at 85° C. and 85% RH for 500 hours, followed by measuring the adhesive strength by the same method. The obtained adhesive strength was defined as adhesive strength after reliability testing.

The adhesive strength was measured by the following method using a universal testing machine (UTM) (Hounsfield Model No. H5KT).

1) After mounting a 5N Load Cell to the testing machine, 2) grips were provided to the testing machine, and 3) a sample was gripped by the grips to measure adhesive strength at a tensile test speed of 50 mm/min.

(2) Connection Reliability

To evaluate circuit connection performance of the anisotropic conductive adhesive films prepared in the Examples and Comparative Examples, pre-compression, primary compression, and reliability testing were performed by the same method as in evaluation of adhesive strength.

Connection reliability measured after pre-compression and primary compression was defined as initial connection reliability, and connection reliability measured under conditions for reliability testing was defined as connection reliability after reliability testing. Results are shown in Table 2.

Connection resistance was measured by a 2-point probe method using a resistance tester, to which two probes are connected to measure resistance between two points. The resistance was calculated and displayed based on voltage measured when 1 mA was applied to the specimen.

(3) Tensile Strength Before Curing

For each of the anisotropic conductive adhesive films prepared in the Examples and Comparative Examples, tensile strength at 25° C. before curing was measured by the following method using a universal testing machine (UTM) (Hounsfield Model No. H5KT).

1) After mounting a 5N Load Cell to the testing machine, 2) grips were provided to the testing machine, and 3) a sample was gripped by the grips to measure adhesive strength at a tensile test speed of 50 mm/min.

TABLE 2

|  | Example 1 | Example 2 | Example 3 | Example 4 | Example 5 | Comparative Example 1 | Comparative Example 2 |
| --- | --- | --- | --- | --- | --- | --- | --- |
| Initial adhesive strength (gf/cm) | 983 | 1046 | 1220 | 1150 | 1177 | 559 | 1100 |
| Adhesive strength after reliability testing (gf/cm) | 920 | 960 | 1050 | 1012 | 1043 | 332 | 1033 |
| Initial connection resistance (Ω) | 0.41 | 0.43 | 0.42 | 0.41 | 0.43 | 0.46 | 0.44 |
| Connection resistance after reliability testing (Ω) | 0.53 | 0.54 | 0.52 | 0.54 | 0.55 | 1.78 | 0.54 |
| Tensile strength before curing (kgf/cm$^2$) | 25 | 16 | 18 | 11 | 5 | 23 | 2 |

As may be seen in Table 2, the anisotropic conductive adhesive compositions and films according to the Examples included 1 wt % to 25 wt % of tetrahydrofurfuryl (meth)acrylate, and thus had higher initial adhesive strength, a lower reduction rate of adhesive strength after reliability testing, and a lower increasing rate of connection resistance after reliability testing than the compositions and films of the Comparative Examples, thereby providing excellent long term connection reliability. In addition, the anisotropic conductive adhesive films according to the Examples had tensile strengths before curing of 5 kgf/cm² or more, indicating good film formability.

By way of summation and review, an anisotropic conductive adhesive film should exhibit connection reliability in order to be used as a bonding material. As to connection resistance, adhesive strength, or the like, the resistance of the film measured in an initial state may increase, or the adhesive strength thereof may decrease, depending on storage conditions of the film, thereby deteriorating connection reliability.

Therefore, the embodiments may provide an anisotropic conductive adhesive composition and a film, which exhibit good adhesion at an initial stage and suppress deterioration in adhesion under conditions for evaluation of long term reliability, thereby providing strong adhesion.

The embodiments may provide an isotropic conductive adhesive composition or a film, which exhibits strong adhesion.

The embodiments may provide an isotropic conductive adhesive composition and film, which may have high connection reliability in terms of adhesion and connection resistance.

The embodiments may provide an anisotropic conductive adhesive composition and film, which have a low reduction rate of adhesion and a low increase rate of connection resistance even after reliability testing.

The embodiments may provide an anisotropic conductive adhesive composition and a film having strong adhesion. The embodiments may also provide a semiconductor device having high connection reliability in terms of adhesion and connection reliability by strong adhesion. The embodiments may also provide a semiconductor device having a low reduction rate of adhesion and a low increasing rate of connection resistance even after reliability testing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device connected using an anisotropic conductive adhesive film, the anisotropic conductive adhesive film comprising:
a thermosetting polymerization initiator; and
tetrahydrofurfuryl (meth)acrylate or furfuryl (meth)acrylate, wherein the tetrahydrofurfuryl (meth)acrylate or furfuryl (meth)acrylate is present in the film in an amount of 1 wt % to 25 wt %, based on the total weight of the film in terms of solid content, and
wherein the anisotropic conductive adhesive film has a tensile strength before curing of 5 kgf/cm² or more.

2. The display device as claimed in claim 1, wherein the tetrahydrofurfuryl (meth)acrylate or furfuryl (meth)acrylate is an alkoxylated tetrahydrofurfuryl (meth)acrylate or alkoxylated furfuryl (meth)acrylate.

3. The display device as claimed in claim 2, wherein the anisotropic conductive adhesive film includes the alkoxylated tetrahydrofurfuryl acrylate, the alkoxylated tetrahydrofurfuryl acrylate having a structure represented by Formula 1:

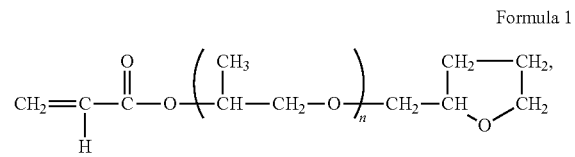

Formula 1 wherein n is an integer from 1 to 10.

4. The display device as claimed in claim 1, wherein the anisotropic conductive adhesive film further includes a thermoplastic resin and conductive particles.

5. The display device as claimed in claim 4, wherein the anisotropic conductive adhesive film further includes a radical polymerizable material, the radical polymerizable material being different from the tetrahydrofurfuryl (meth)acrylate or furfuryl (meth)acrylate.

6. The display device as claimed in claim 1, wherein an anisotropic conductive adhesive film has an adhesive strength reduction rate of greater than 0 to 25% or less as measured according to Equation 1:

Adhesive strength reduction rate (%)=|(A−B)/A|×100,  [Equation 1]

in which:
A is an adhesive strength of the adhesive film after being subjected to pre-compression at 80° C. under a load of 1 MPa for 1 second and primary compression at 180° C. under a load of 3 MPa for 5 seconds, and
B is an adhesive strength of the film after being subjected to the pre-compression and the primary compression, followed by reliability testing at 85° C. and 85% RH for 500 hours.

7. The display device as claimed in claim 1, wherein the anisotropic conductive adhesive film further includes a thermoplastic resin that is present in an amount of 50 wt % to 80 wt %, based on the total weight of the anisotropic conductive adhesive film in terms of solid content.

8. A display device, comprising:
a first connecting member having a first electrode;
a second connecting member having a second electrode; and
an anisotropic conductive adhesive film between the first connecting member and the second connecting member and connecting the first electrode to the second electrode, the anisotropic conductive adhesive film being prepared from a composition including:
a thermosetting polymerization initiator, and
1 wt % to 25 wt % of tetrahydrofurfuryl (meth)acrylate or furfuryl (meth)acrylate based on a total weight of the anisotropic conductive adhesive film in terms of solid content, and
wherein the anisotropic conductive adhesive film has a tensile strength before curing of 5 kgf/cm² or more.

* * * * *